United States Patent
Seidel et al.

(10) Patent No.: US 6,519,744 B2
(45) Date of Patent: Feb. 11, 2003

(54) SEMICONDUCTOR DIE MANUFACTURE METHOD TO LIMIT A VOLTAGE DROP ON A POWER PLANE THEREOF BY NONINVASIVELY MEASURING VOLTAGES ON A POWER PLANE

(75) Inventors: Steven G. Seidel, Fremont, CA (US); Travis M. Eiles, San Jose, CA (US); Gary L. Woods, Sunnyvale, CA (US); Stefan Rusu, Sunnyvale, CA (US); Dean J. Grannes, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 177 days.

(21) Appl. No.: 09/735,742

(22) Filed: Dec. 12, 2000

(65) Prior Publication Data
US 2002/0073386 A1 Jun. 13, 2002

(51) Int. Cl.$^7$ .................. G06F 17/50; H01L 23/495
(52) U.S. Cl. .................. 716/4; 257/528; 257/666; 257/707; 257/712; 257/724
(58) Field of Search .................. 716/1–21; 174/52.4; 257/528, 666, 707, 712, 724; 324/751, 758, 763; 361/763, 782; 374/126, 161; 438/15, 401; 702/135

(56) References Cited

U.S. PATENT DOCUMENTS 4,695,794 A * 9/1987 Bargett et al. .............. 324/751
5,713,666 A * 2/1998 Seelin et al. ............... 374/126
6,168,311 B1 * 1/2001 Xiao et al. .................. 374/161
6,311,782 B1 * 12/2001 White et al. ................ 324/763

* cited by examiner

Primary Examiner—Vuthe Siek
Assistant Examiner—Helen B Rossoshek
(74) Attorney, Agent, or Firm—Blakely, Sokoloff, Taylor & Zafman LLP

(57) ABSTRACT

A method is provided for manufacturing a die. A supply voltage is provided to a power plane of a selected integrated circuit, formed in and on a semiconductor substrate, having a selected design, so that a respective test current flows through a plurality of test elements, of the selected integrated circuit, each being connected to a respective test point on the power plane, the test points being spaced from one another. A magnitude of each respective test current is detected. A respective test voltage is calculated at each respective test point utilizing the respective magnitude of the respective test current flowing through the respective test element connected to a respective test point. The respective test voltages are utilized to determine at which ones of the test points the respective test voltages are more than a predetermined maximum below a supply voltage. The electric design is altered to an altered electric design if any of the test voltages are below a predetermined minimum below the supply voltage. An integrated circuit having the altered design is then manufactured on another semiconductor substrate.

21 Claims, 13 Drawing Sheets

SEMICONDUCTOR DIE MANUFACTURE METHOD TO LIMIT A VOLTAGE DROP ON A POWER PLANE THEREOF BY NONINVASIVELY MEASURING VOLTAGES ON A POWER PLANE

BACKGROUND OF THE INVENTION

1). Field of the Invention

This invention relates to a method of manufacturing a semiconductor die to limit a voltage drop on a power plane thereof.

2). Discussion of Related Art

Integrated circuits are often manufactured on semiconductor substrates and may include many (literally millions) transistors, capacitors, diodes and other electrical elements. The integrated circuit also includes a power plane (Vcc plane) and a ground plane (Vss plane). Many of the electrical elements are connected to the Vcc plane and other ones of the electrical components are connected to other electrical components which are connected to the power plane.

A voltage of a predetermined magnitude is applied to the power plane. It is required that a voltage level at respective points on the power plane to which the electrical elements are connected be sufficiently close to the voltage applied to the power plane in order to ensure correct functioning of the elements of the integrated circuit. The integrated circuit should therefore be designed in a manner wherein there is not an unreasonably high voltage drop on the power plane.

BRIEF DESCRIPTION OF THE DRAWINGS

The invention is further described by way of example with reference to the accompanying drawings wherein.

DETAILED DESCRIPTION OF THE INVENTION

Figure 1A:
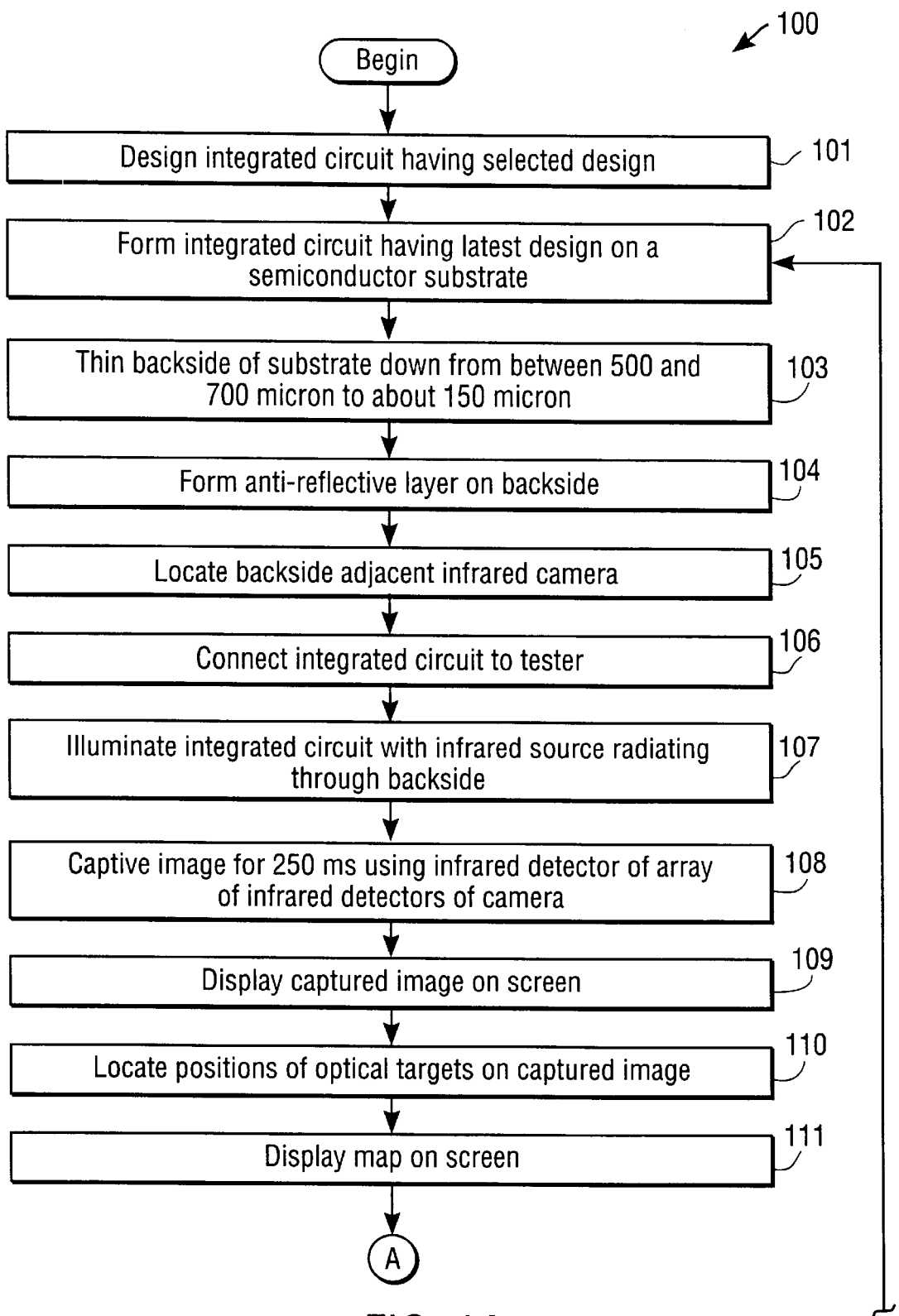
FIGS. 1A, 1B, and 1C is a flow chart of a method, according to the invention, of manufacturing a die.
Figure 1B:
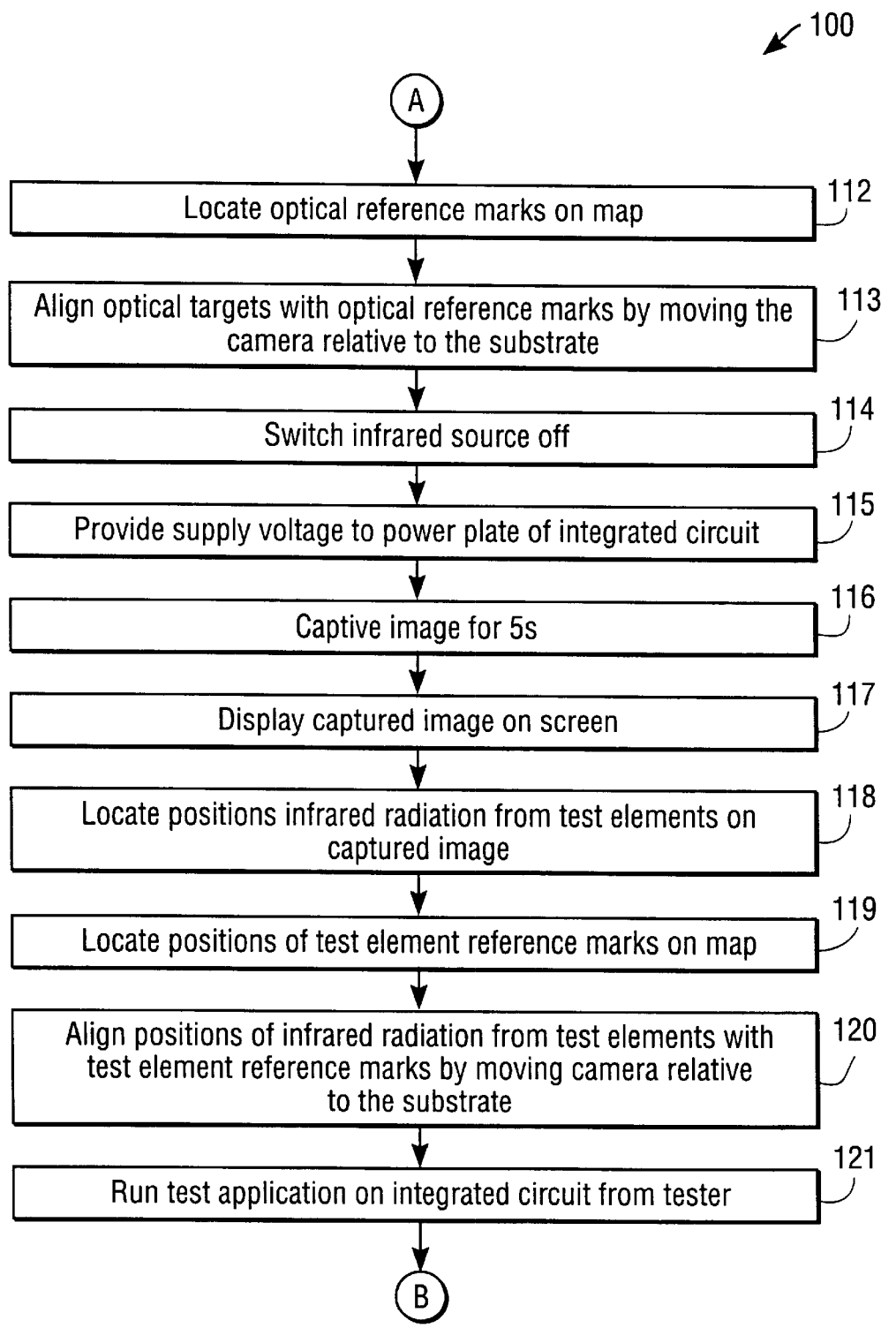
Figure 1C:
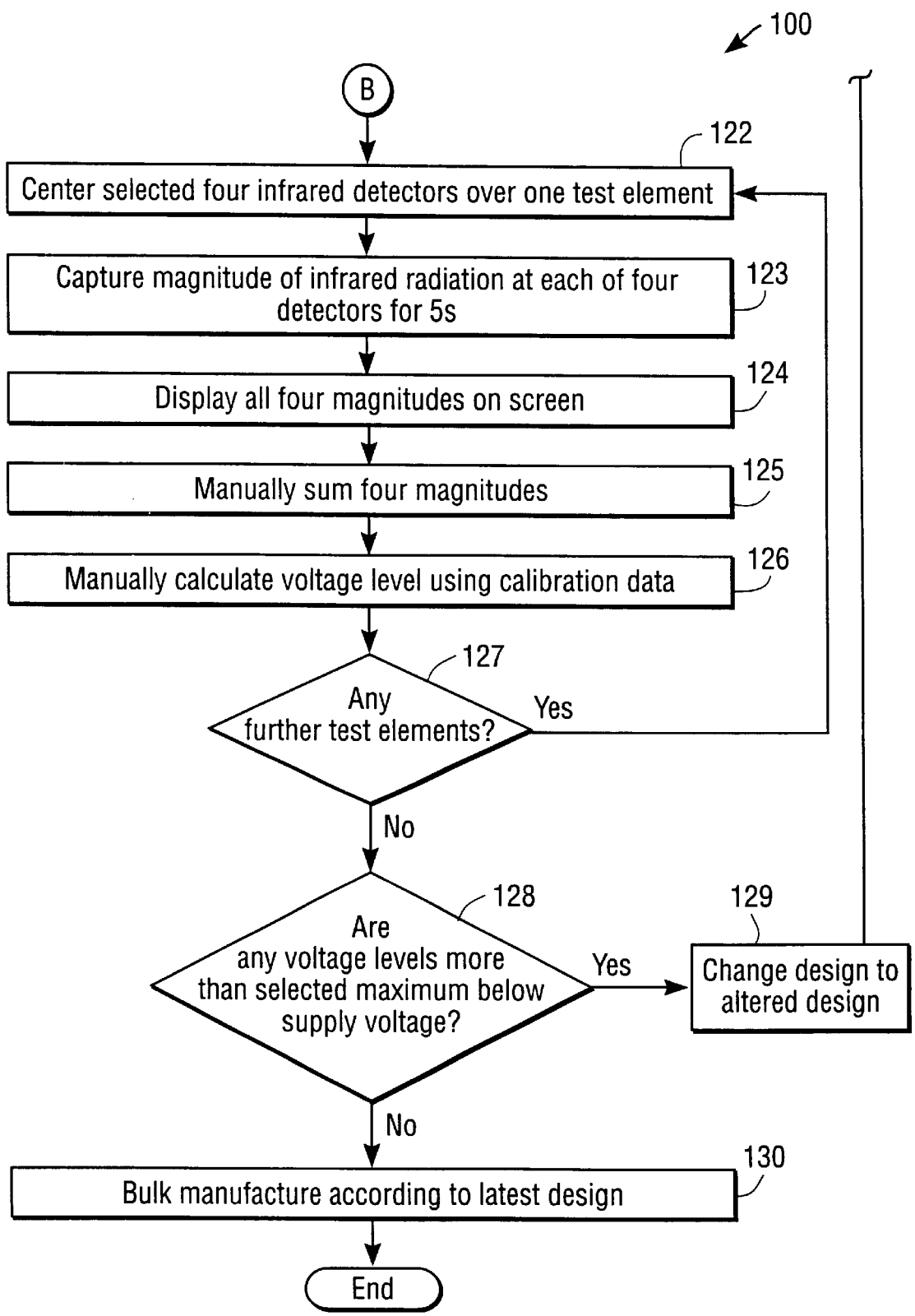

FIG. 1 of the accompanying drawings illustrates a die manufacture method 100 according to one embodiment of the invention. A reiterative design process is carried out by following step 101 to 129. Step 130 is then executed which is a bulk manufacture step according to a latest design. FIG. 1 is now described in more detail. Reference will also be made to the figures following FIG. 1 to assist in the interpretation of FIG. 1.

In step 101 an integrated circuit is designed by a design team. The integrated circuit has a selected design, i.e. a selected layout of electrical components including transistors, capacitors, diodes and other electrical components. The factors that influence the selected design are primarily logic functionality. Factors that influence power supplied to the various electrical components are generally not considered.

In step 102 an integrated circuit having the latest design, i.e. the selected design of step 101 is manufactured on a semiconductor substrate. Methods of forming integrated circuits on semiconductor substrates are known in the art.

Figure 2:
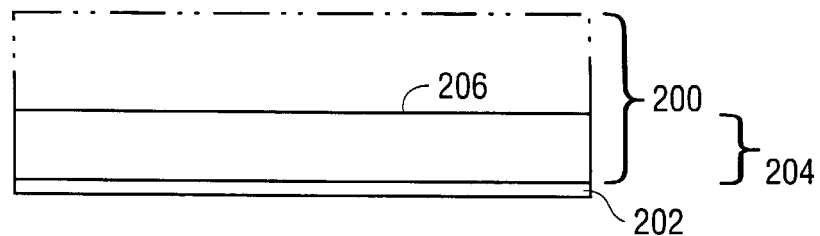
FIG. 2 is a side view of a substrate having an integrated circuit formed thereon, showing thinning down of the substrate.

Next, in step 103 a backside of the substrate is thinned down from its original thickness of between 500 and 700 micron to about 150 micron. FIG. 2 illustrates step 3 in more detail. A substrate 200 has an initial thickness of between 500 and 700 micron and has an integrated circuit 202 formed therein and thereon. The substrate 200 is thinned down in a grinding and polishing operation to a remaining substrate 204 of about 150 micron thick. The remaining substrate 204 is sufficiently thin to allow for infrared radiation to be radiated from the integrated circuit through the remaining substrate 204 out of a backside 206 of the remaining substrate 204, the backside 206 being located on an opposite side of the remaining substrate 204 than the integrated circuit 202.

Figure 3:
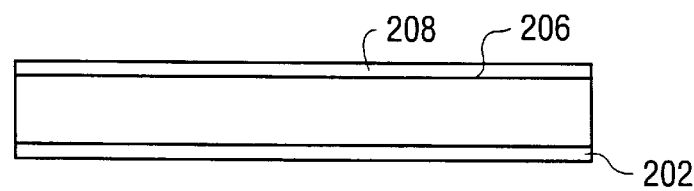
FIG. 3 is a side view of the substrate that remains after being thinned down, and after an anti-reflective layer is formed on the backside.

Next, in step 104 an anti-reflective layer is formed on the backside of the substrate. This is illustrated in FIG. 3. An anti-reflective layer 208 is shown formed on the backside 206. The anti-reflective layer is typically made of silicon dioxide ($SiO_2$). The material of the anti-reflective layer 208 is selected so as to more easily absorb infrared radiation than a surface of the backside 206.

Figure 4:
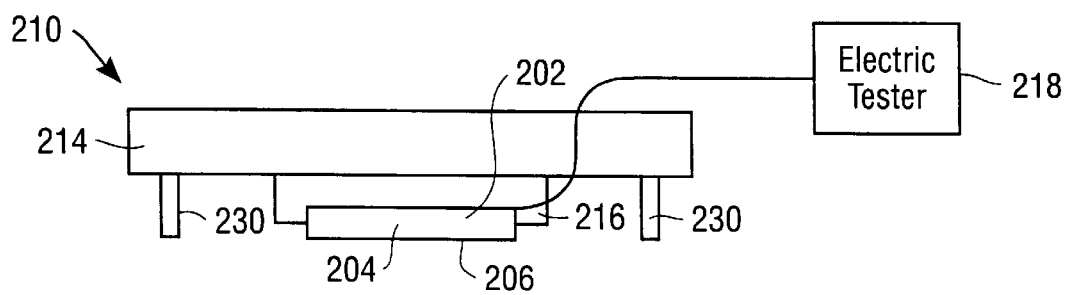
FIG. 4 is a side view showing in schematic detail one system that is used for carrying out the invention.
Figure 4:
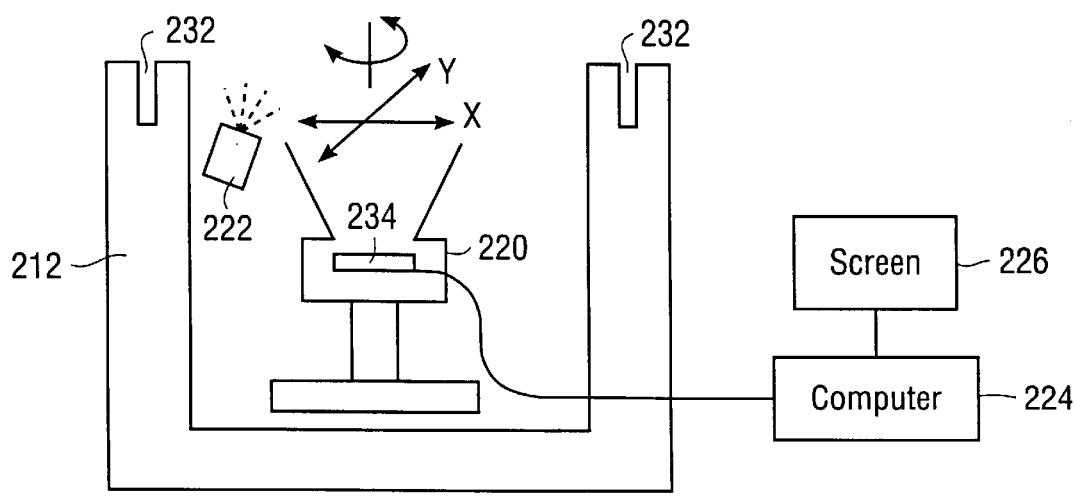

Next, in step 105, the backside of the substrate is located adjacent an infrared camera. FIG. 4 illustrates the remaining substrate 204 mounted in a test setup 210. The setup 210 includes a lower frame 212, an upper frame 214, a holder 216 for the remaining substrate 204, an electrical tester 218, a camera 220, an infrared illuminator 222, a computer 224, and a screen 226. The holder 216 is secured to the upper frame 214. The upper frame 214 has a plurality of pins 230 thereon which can be brought into engagement with complementary openings 232 in the lower frame 212. The camera 220 is mounted to the lower frame 212 and is moveable in x- and y-directions and is rotational about an axis normal to the x- and y-directions. The illuminator 222 is also mounted to the lower frame 212.

The camera 220 has a photodetector array 234 therein. Each photodetector is capable of detecting infrared light. The computer 224 is connected to the photodetector array 234 and the screen 226 is connected to the computer 224.

In use, step 106 in FIG. 1 is executed wherein the integrated circuit 202 is connected to the electric tester 218. The electric tester 218 is capable of providing power to a Vcc plane of the integrated circuit 202. The electric tester 218 is also capable of running a software application on the integrated circuit 202. Such a software application may be an application that is customized specifically for testing, or may be a more conventional software application such as word processing application, an application for making drawings, etc. The pins 230 are then brought into register with the openings 232, thereby bringing the remaining substrate 204 in a stationary relationship relative to the lower frame 212. The illuminator 222 can radiate through the anti-reflective layer on the backside 206, and radiation can reflect from electric components of the integrated circuit 202 back through the backside 206 to the camera 220. The photodetector array 234 can capture an infrared image that is radiated from the backside 206, and provides the image to the computer 224. The image can then be displayed on the screen 226. Movement of the camera 220 in the x- and y-directions and rotation thereof about its axis changes an image represented on the screen 226. Further details of the system 210 are conventional in the art and are not elaborated on herein.

Next, step 107 is executed wherein the integrated circuit is illuminated with the infrared source. The infrared source radiates infrared radiation through the backside of the integrated circuit. The infrared source remains on while step 108 is executed. In step 108 an infrared image being radiated from the backside of the remaining substrate is captured for 250 milliseconds using the infrared photodetector array of the camera.

Figure 5:
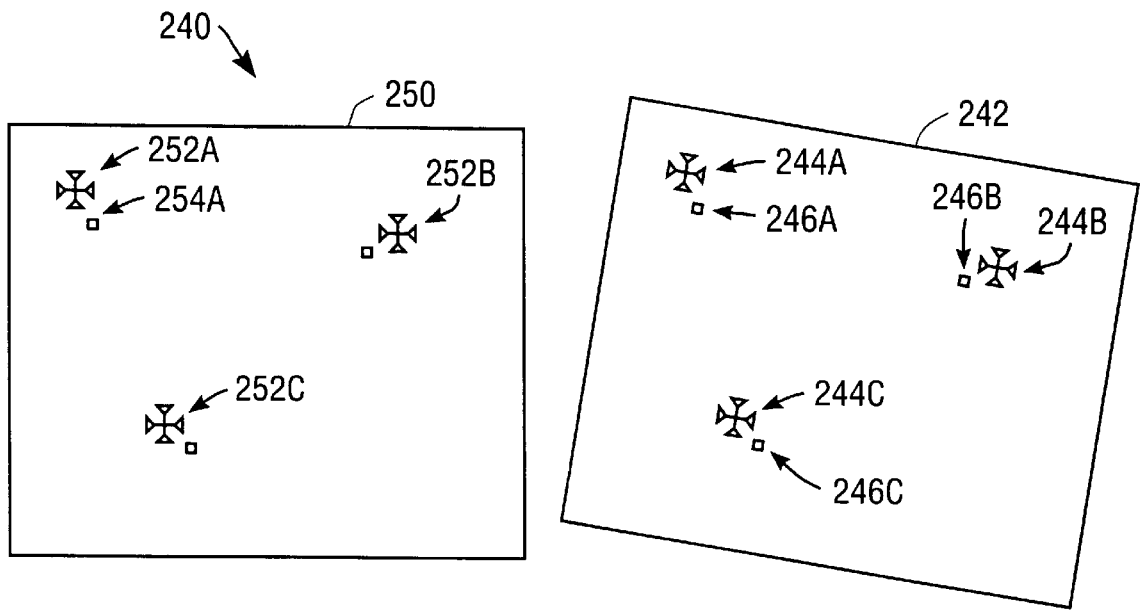
FIG. 5 is a display on a screen showing a captured image of infrared illuminated components, and map of the integrated circuit.
Figure 6:
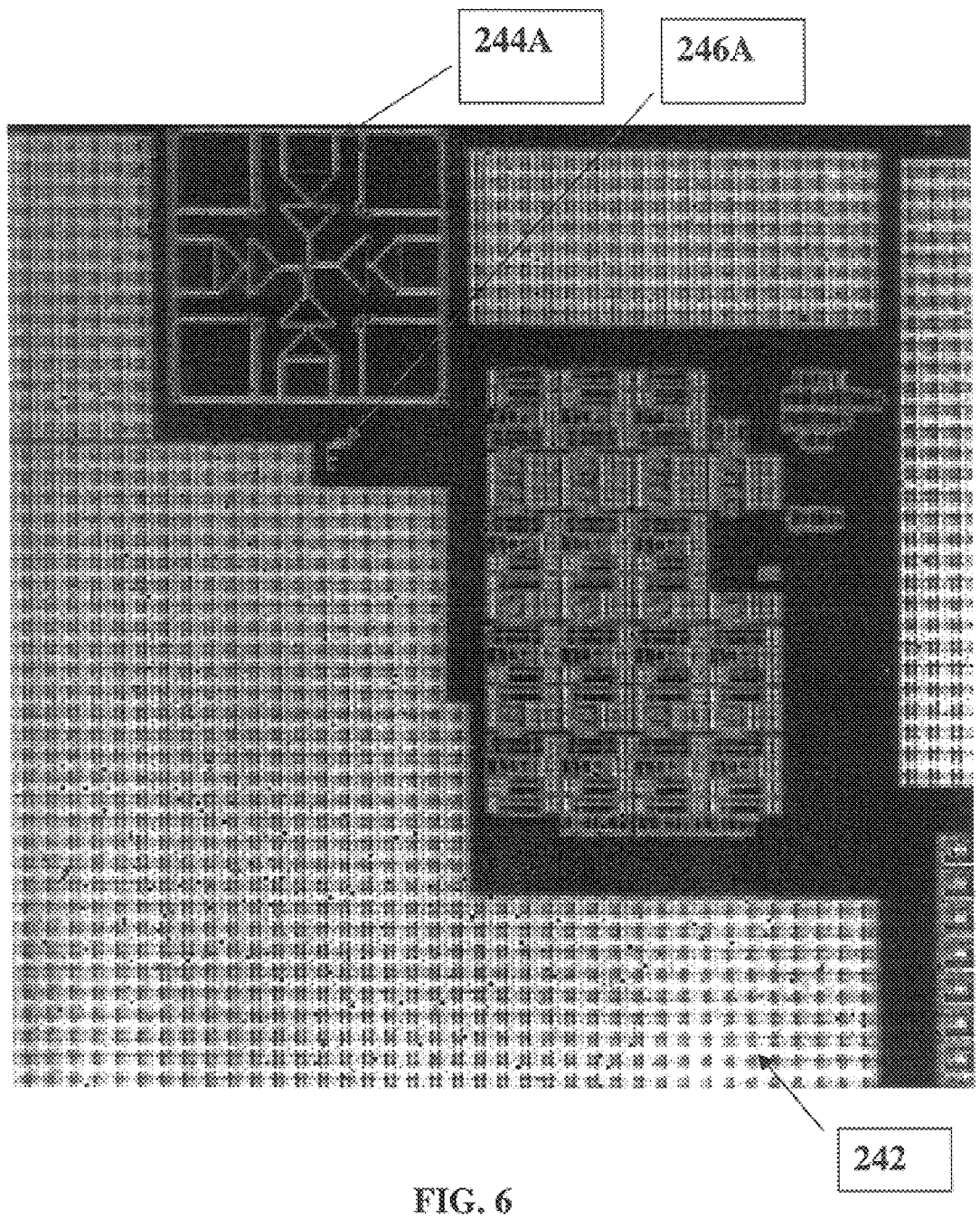
FIG. 6 is a screen print showing optical targets and test elements that are illuminated.

Next step 106 is executed wherein an image of what is captured in step 108 is displayed on the screen, as is further illustrated in FIG. 5 which illustrates a display 240 on the screen. The captured image is represented by reference numeral 242. The captured image 242 includes three (or more) optical targets 244A, 244B, and 244C. Infrared radiation is also reflected from three (or more) electrical test elements 246A, 246B, and 246C. FIG. 6 illustrates a portion of the image 242 including the illuminated target 244A, the illuminated test element 246A, and other electrical components also being illuminated. An operator executes step 110 wherein the operator locates the positions of at least three of the optical targets 244A, 244B, and 244C on the captured image 242.

Next, step 111 is executed wherein a map is displayed on the screen. This is also illustrated in FIG. 5 which shows the map 250. Before being displayed, the map is stored in memory in the computer and, once displayed, displays three (or more) optical reference marks 252A, 252B, and 252C, as well as three (or more) test element reference marks 254A, 254B, and 254C. An operator executes step 112 wherein the operator locates each one of the optical reference marks 252A, 252B, and 252C on the map 250.

Figure 7:
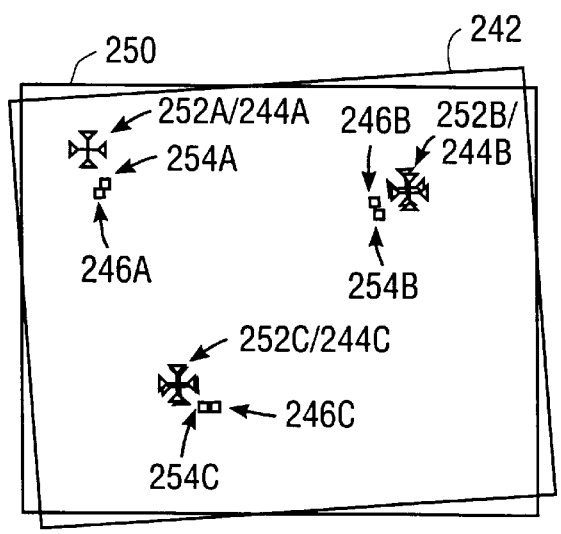
FIG. 7 is a display on the screen illustrating rough alignment of the captured image with the map.

Next, step 113 is executed wherein the optical targets are aligned with the optical reference marks by moving the camera relative to the substrate, as is further illustrated in FIG. 7. The camera is moved and rotated so that the optical target 244A falls on the optical reference mark 252A, the optical target 244B falls on the optical reference mark 252B, and the optical target 244C falls on the optical reference mark 252C. It can be seen that the image 242 is not perfectly aligned with the map 250. Misalignment occurs because of diffraction in infrared radiation that transmits into and out of the remainder of the substrate. Aligning the optical targets 244 with the optical reference marks 252 only provides a rough alignment of the image 242 with the map 250.

Figure 8:
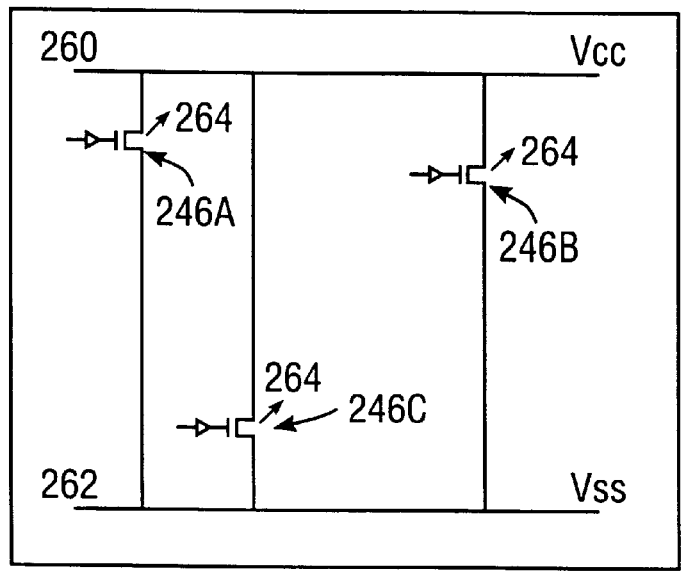
FIG. 8 is a view illustrating a layout of the electrical test elements.

Next, step 114 is executed wherein the infrared source is switched off. Step 115 is then executed where a supply voltage is applied to a power plane of the integrated circuit, as is further illustrated in FIG. 8. The electrical test elements are in fact transistors. Each transistor has a source either directly connected to a Vcc power plane 260 or indirectly connected through one or more electrical devices with known voltage drops to the Vcc power plane 260, and a drain directly connected to a Vss ground plane 262. When a voltage is applied to the Vcc plane 260 and the electrical test elements 246 are switched on, and infrared radiation 264 radiates from a respective electrical test element 246. The infrared radiation 264 radiates from the backside of the remaining substrate.

Step 116 is then executed wherein the camera captures an image of the backside for five seconds. FIG. 7 illustrates the positions of the test elements 246 as captured in step 117. It can be seen that there is still some misalignment between the test elements 246 and the test elements reference marks 254.

Figure 9:
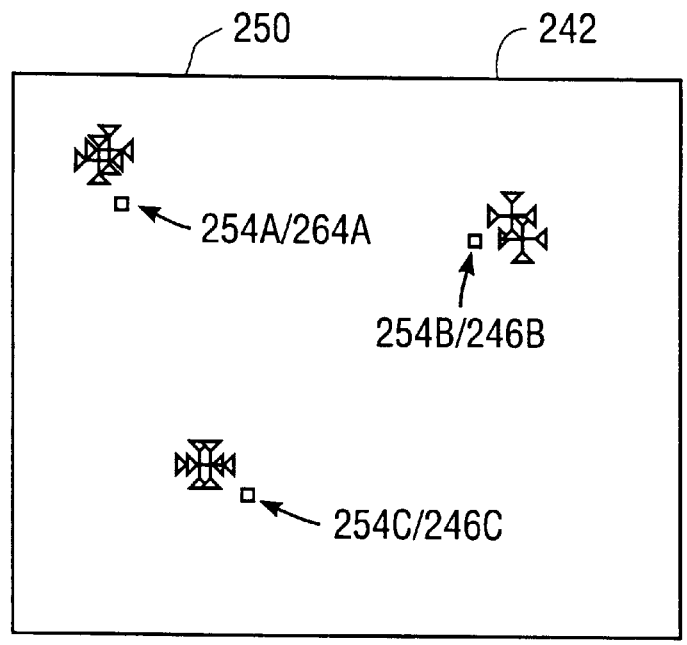
FIG. 9 is a display on the screen after radiation locations of the electrical test elements are brought into alignment with test element reference marks.
Figure 10:
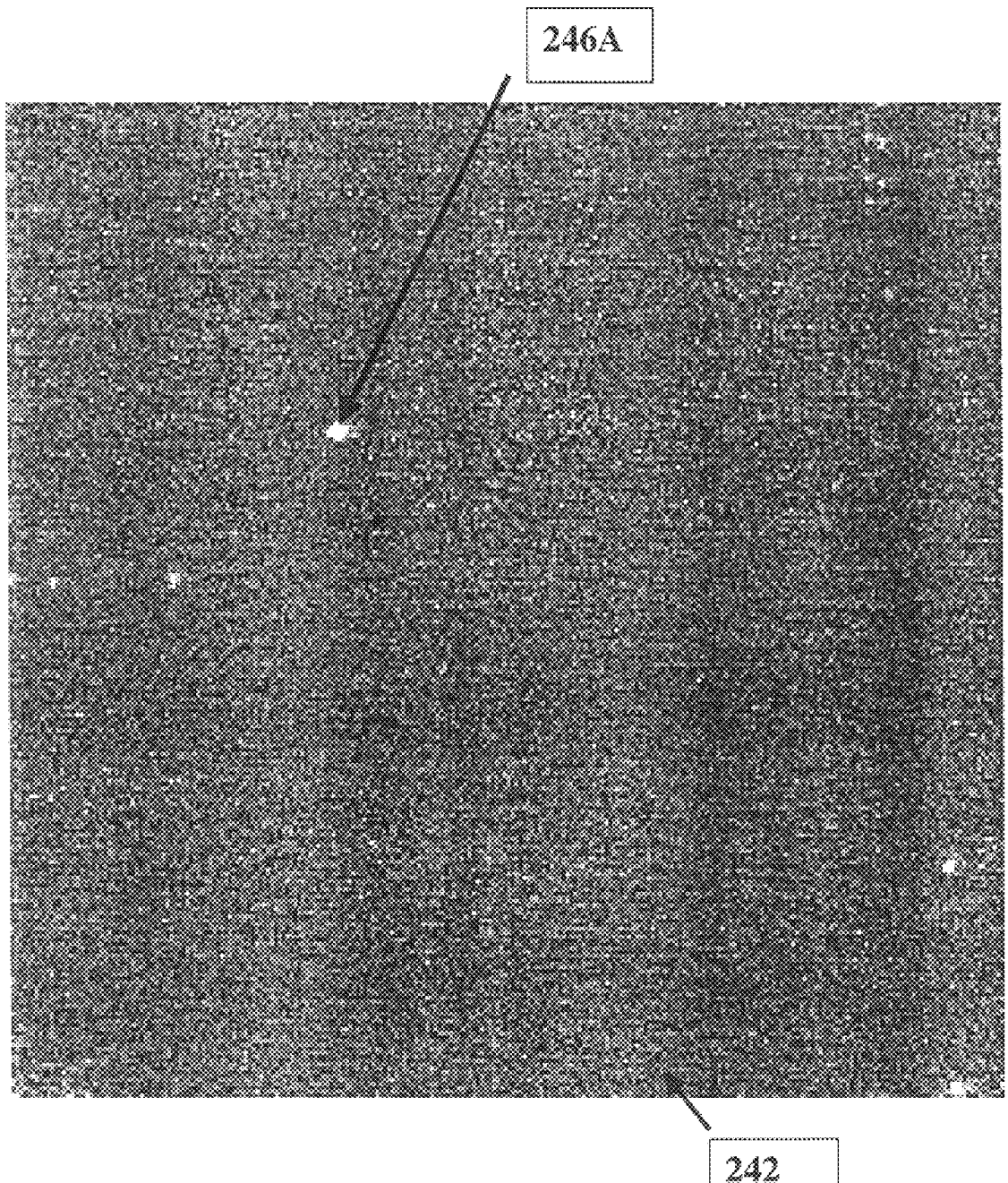
FIG. 10 is a screen print illustrating one test element that radiates infrared radiation.

An operator executes step 118 wherein the operator locates the positions of the infrared radiation from the test elements 246 on the captured image 242. The operator then executes step 119 wherein the operator locates the positions of the test element reference marks 254 on the map 250. The operator then executes step 120 wherein the positions of the infrared radiation from the test elements 246 are aligned with the test element reference marks 254 by moving the camera relative to the substrate, as is further illustrated in FIG. 9. It can be seen from FIG. 9 that the map 250 is aligned with the image 242 once the infrared radiation from the test elements 246 are aligned with the test element reference marks 254. By aligning the radiation from the test elements 246 with the test element reference 254, fine alignment between the map 250 and the image 242 is obtained. FIG. 10 illustrates a portion of the image 242 captured in step 116, including the radiation from the test element 246A.

Figure 11:
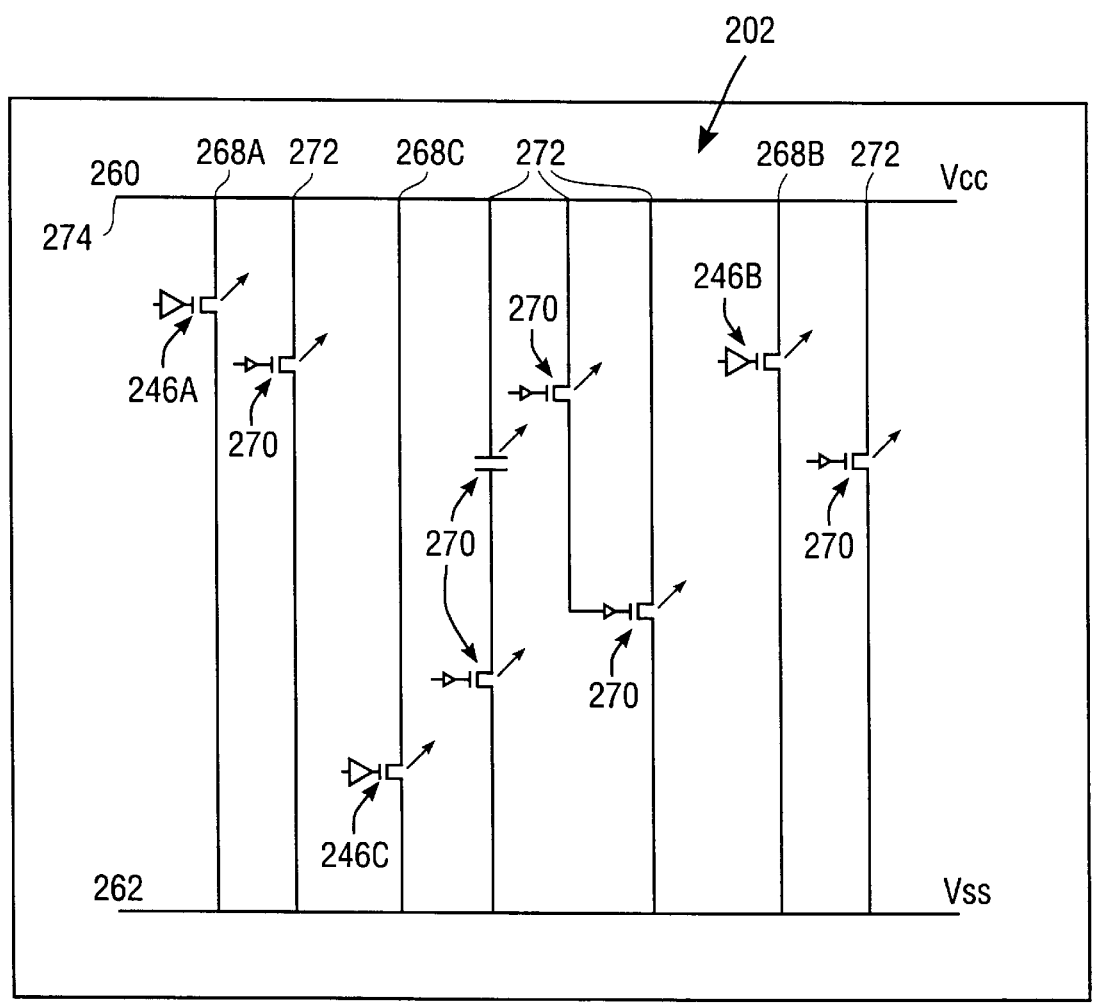
FIG. 11 is a view illustrating the integrated circuit when a software application is run thereon.

Next, in step 121, a test application is run on the integrated circuit from the tester, as is further illustrated with the assistance of FIG. 11. FIG. 11 illustrates the integrated circuit 202 in schematic detail. The integrated circuit 202 includes the Vcc plane 260, the Vss plane 262, the test elements 246 and a large number (literally millions) of other electrical components 270. The electrical components 270 include transistors, capacitors, diodes and other electrical components. Each electrical component 270 has a terminal either directly connected to the Vcc plane 260 or connected to one or more other electrical components having a terminal connected to the Vcc plane 260. The electrical test element 246A is connected to the Vcc plane 260 at a test point 268A, the electrical test element 246B is connected to the Vcc plane 260 at a test point 268B, and the electrical test element 246C is connected to the Vcc plane 260 at a test point 268C. The test points 268A, 268B, and 268C are spaced from one another and the electrical components 270 are connected to the Vcc plane 260 at other points 272 between the test points 268A, 268B, and 268C. When an application is run from the tester, the electrical elements 270 are powered up and, when the electrical elements 270 are powered up, a voltage drop may occur on the Vcc plane 260 from a location 274 where a supply voltage is applied to the Vcc plane 260 to one of the locations 272. Such a voltage drop, if more than a predetermined maximum, may result in malfunctioning of one or more of the electrical elements 270 due to insufficient voltage applied to the electrical elements 270.

Figure 12:
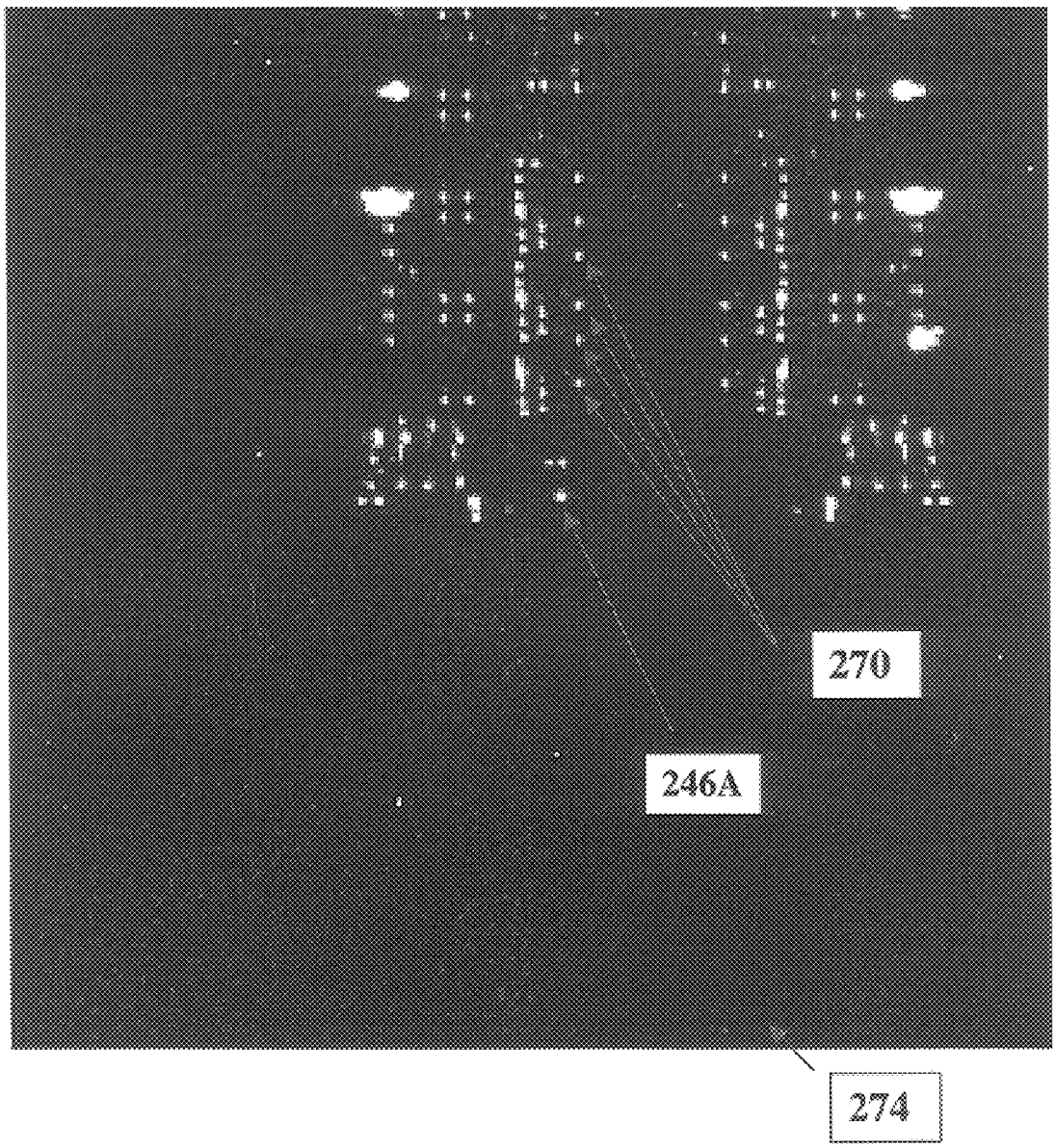
FIG. 12 is a screen print illustrating infrared radiation from electric components and an electric test element of the integrated circuit.

FIG. 12 illustrates an image 274 which is captured when an application is run on the integrated circuit. The electrical elements 270 all radiate infrared radiation, but the electrical test element 246 is identifiable by an operator due to prior alignment with a map as hereinbefore described.

Step 122 is then executed, either automatically by the computer or by an operator. In step 122 four of the infrared detectors in the camera are centered over one of the test elements of the integrated circuit, as is further illustrated with reference to FIG. 13. Each infrared detector detects an area 280 of about 2 microns wide and 2 microns long. One of the test elements, for example the test element 246A is centered over four of the areas 280A, 280B, 280C, and 280D. Step 123 is then executed wherein a magnitude of infrared radiation is detected in each one of the areas 280, including the areas 280A, 280B, 280C, and 280D for a total of five seconds.

Figures 13, 14:
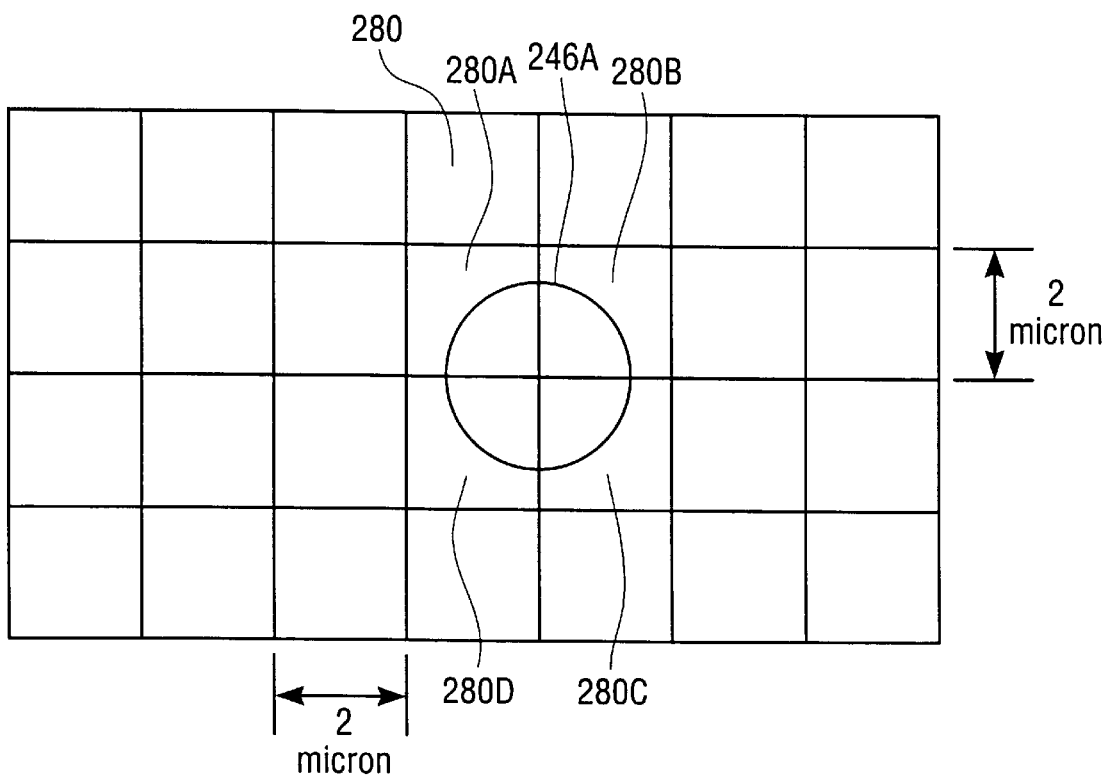
FIG. 13 is a view illustrating how four infrared photodetectors are aligned with one electrical test element.
FIG. 14 is a display on the screen illustrating a magnitude of infrared radiation detected by each photodetector.

The magnitude of the infrared radiation is then displayed on the screen in step 124. FIG. 14 illustrates a display 290 on the screen of the respective magnitude at the respective areas 280. The magnitude of the infrared radiation at the area 280A is 711 counts (cts). Similarly, the magnitudes of infrared radiation at the areas 280B, 280C, and 280D are 803 cts, 632 cts, and 580 cts, respectively. An operator executes step 125 wherein the operator sums the four magnitudes of the areas 280A, 280B, 280C, and 280D manually. The sum of the magnitudes, in the present example is 2726 cts for the five seconds captured in step 123. This value can be represented in FIG. 15 where it is indicated that the test element 246A radiates 2726 cts of infrared radiation in five seconds. Because infrared radiation is generated when a test current flows through the test element, the magnitude of infrared radiation provides an indirect indication of a magnitude of test current flowing through a respective test element. As will be described below, the magnitude of the infrared radiation is used to determine voltage levels over the Vcc plane 260. The locations of the test elements 246 are chosen to correspond to areas of the Vcc plane 260 which, according to design or prior testing, are believed to have low voltage levels.

Figure 16:
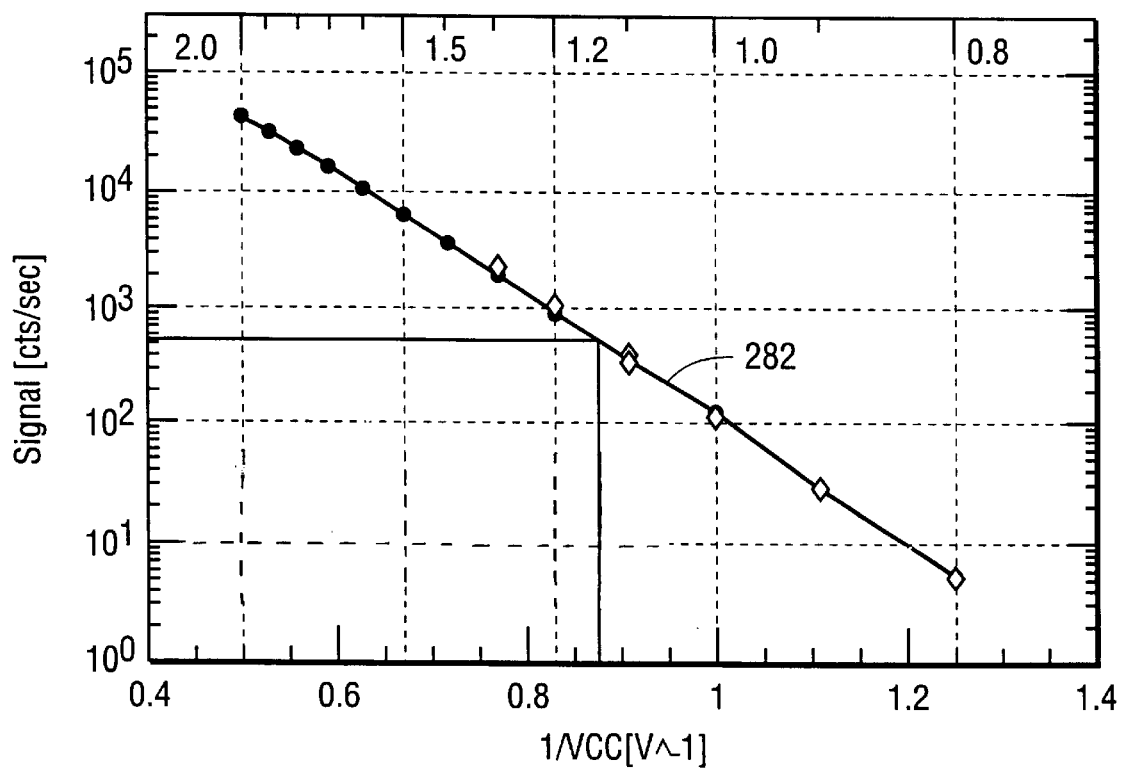
FIG. 16 is a graph of calibration data of infrared radiation, a magnitude of infrared radiation being on the ordinate and an inverse of voltage level being on the abscissa, which is used by an operator to determine voltage levels at test points to which the test elements are connected to a power plane.

Calibration data is drawn up by the operator which the operator can use in step 126 to calculate a voltage level at the test point 268A to which the test element 246A is connected. Such calibration data is shown in FIG. 16. Infrared radiation is shown on the ordinate and the inverse of a voltage through a test element is shown on the abscissa. Infrared radiation increases exponentially with an increase in voltage. Infrared radiation of 2726 cts in five seconds equals infrared radiation of 545 cts per second (cts/sec). The operator reads the value from a line 282 on the graph shown. It can be seen that reading the value of 545 cts/sec from the ordinate of the graph, yields an inverse of the voltage on the abscissa of about 0.875, or a voltage level of about 1.176 volt. The voltage at the test point 268A is thus 1.176 volt.

Figure 15:
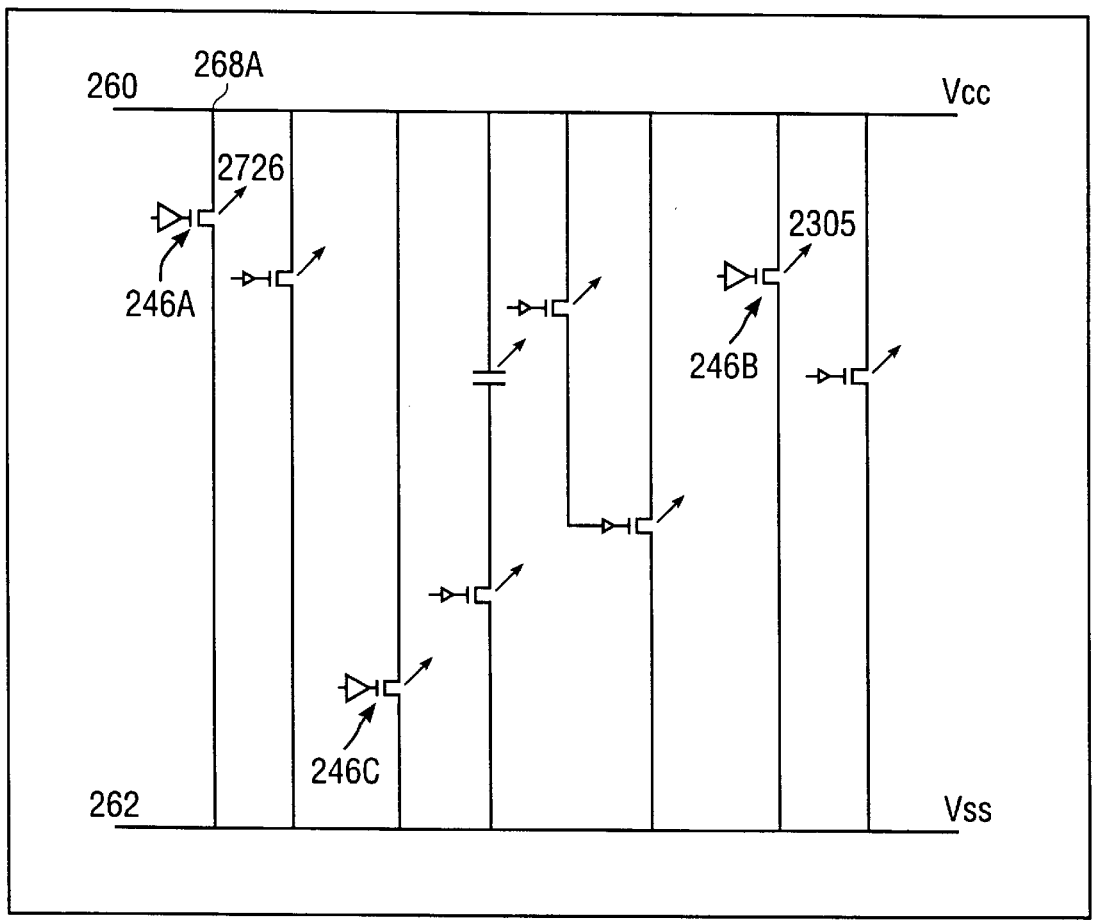
FIG. 15 is a view of the integrated circuit, including a magnitude of radiation radiated by each test element.

In step 127, the operator then makes a determination whether there are any further test elements for which voltage levels have to be calculated. In the present case, for example, the voltage levels for the test elements 246B and 246C have not been calculated. There are thus additional elements for which voltage levels have to be calculated. Therefore, the operator then again executes step 122 wherein the infrared detectors that were centered over the test element 246A are centered over the test element 246B, whereafter steps 123 to 127 are executed for test element 246B, and the process of steps 122 to 127 is repeated for test element 246C. Consistency in measurement is established when the same detectors are used for detecting a magnitude of infrared radiation for each test element 246A, 246B, and 246C. As represented in FIG. 15, it can be seen that the test element 246B, by way of example, radiates 2305 cts of infrared radiation in five seconds and the test element 246C radiates 2863 cts of infrared radiation in five seconds.

Upon a determination by the operator at step 127 that there are no further test elements for which voltage levels have to be calculated, 128 is executed. At step 128, the determination is made whether there are any voltage levels that are more than a selected maximum below a supply voltage. Supply voltage supplied to the location 274 in FIG. 11 may for example be about 1.2V. There would therefore be a voltage drop of about 0.023V between the voltage applied at the location 274 and the voltage at the test point 268A. A voltage drop is calculated between the point 274 where the voltage is applied and the test point 268B and a voltage drop is also calculated between the point 274 and the test point 268C. Should a determination be made step 128A that any one of the voltage drops is more than a selected maximum, for example 0.050V, then step 129 is executed. In step 129 the design of step 101 is altered to an altered design. The intention of the altered design is to reduce the amount of voltage drop or voltage drops to the test points 268A, 268B, and 268C. Following step 129, step 122 is again executed wherein a new integrated circuit is formed on a new semiconductor substrate having the latest design of step 129. The new integrated circuit is then processed according to steps 103 to 127, whereafter another determination is made in step 128. When not one of the voltage levels drops more than the selected maximum, then step 130 is executed. According to step 130 the latest design of step 129 is used to manufacture integrated circuits on substrates in bulk for purposes of sale.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A die manufacture method, comprising:
   (i) providing a supply voltage to a power plane of a selected integrated circuit, formed in and on a semiconductor substrate, having a selected electric design, so that a respective test current flows through a plurality of test elements, of the selected integrated circuit, each being connected to a respective test point on the power plane, the test points being spaced from one another;
   (ii) detecting a magnitude of each respective test current; and
   (iii) calculating a respective test voltage at each respective test point utilizing the respective magnitude of the respective test current flowing through the respective test element connected to the respective test point.

2. The method of claim 1, further comprising:
   (iv) utilizing the respective test voltages to determine at which ones of the test points the respective test voltages are more than a predetermined maximum below the supply voltage;
   (v) altering the selected electric design to an altered electric design if any of the test voltages are more than a predetermined maximum below the supply voltage; and (vi) forming an integrated circuit having the altered electric design on another semiconductor substrate.

3. The method of claim 2, further comprising:

repeating steps (i) to (vi) with the altered electric design being the selected electric design.

4. The method of claim 1 further comprising:

running a test application of the selected integrated circuit, wherein step (ii) is executed when the test application is run on the selected integrated circuit.

5. The method of claim 1 wherein step (ii) is executed by detecting a magnitude of infrared radiation radiated from each respective test element.

6. The method of claim 5 wherein the test elements are test transistors.

7. The method of claim 5 wherein the infrared radiation is detected by infrared detectors of an infrared detector array of an infrared camera.

8. The method of claim 7 wherein the magnitude of infrared radiation is displayed on a screen of a computer.

9. The method of claim 7 further comprising:

locating at least two of the infrared detectors over each of the test elements, the two detectors jointly detecting the magnitude of infrared radiation.

10. The method of claim 7 further comprising:

moving the infrared detectors relative to the test elements so that the same infrared detectors are used to detect infrared radiation from each of the test elements.

11. The method of claim 7 wherein step (iii) is manually executed by an operator.

12. The method of claim 11 wherein the operator reads the respective test voltages from calibration data of test voltages as a function of infrared radiation.

13. The method of claim 5 further comprising:

locating a position from which infrared radiation is radiated from each test element on a computer screen; and aligning the positions of the infrared radiation with test element reference marks on a map on the computer screen.

14. The method of claim 13 further comprising:

illuminating the selected integrated circuit with infrared radiation from an infrared source;

locating respective positions of a plurality of optical targets that are illuminated by the infrared source on the computer screen; and aligning the positions of the optical targets with optical target reference marks on the map.

15. The method of claim 7 further comprising:

forming an anti-reflective layer on a backside of the semiconductor substrate, the infrared radiation being through the anti-reflective layer.

16. The method of claim 7 further comprising:

thinning the semiconductor substrate down.

17. A die manufacture method, comprising:

(i) providing a supply voltage to a power plane of a selected integrated circuit, formed in and on a semiconductor substrate, having a selected electric design, so that a respective test current flows through a plurality of test elements, of the selected integrated circuit, each being connected to a respective test point on the power plane, the test points being spaced from one another;

(ii) detecting a magnitude of infrared radiation from each respective test element;

(iii) calculating a respective test voltage at each respective test point utilizing the respective magnitude of the respective infrared radiation from the respective test element connected to the respective test point;

(iv) utilizing the respective test voltages to determine at which ones of the test points the respective test voltages are more than a predetermined maximum below the supply voltage;

(v) altering the selected electric design to an altered electric design if any of the respective test voltages are more than the predetermined maximum below the supply voltage; and (vi) forming an integrated circuit having the altered design on another semiconductor substrate.

18. The method of claim 17 further comprising:

repeating steps (i) to (vi) with the altered electric design being the selected electric design.

19. A die manufacture method, comprising:

(i) providing a supply voltage to a power plane of a selected integrated circuit, formed in and on a semiconductor substrate, having a selected electric design, so that a respective test current flows through a plurality of test elements, of the selected integrated circuit, each being connected to a respective test point on the power plane, the test points being spaced from one another;

(ii) locating a position from which infrared radiation is radiated from each test element on a computer screen;

(iii) aligning the positions of the infrared radiation with test element reference marks on a map on the computer screen;

(iv) detecting a magnitude of infrared radiation from each respective test element;

(v) calculating a respective test voltage at each respective test point utilizing the respective magnitude of the respective infrared radiation from the respective test element connected to the respective test point;

(vi) utilizing the respective test voltages to determine at which ones of the test points the respective test voltages are more than a predetermined maximum below the supply voltage;

(vii) altering the selected electric design to an altered electric design if any of the respective test voltages are more than the predetermined maximum below the supply voltage; and (viii) forming an integrated circuit having the altered design on a semiconductor substrate.

20. The method of claim 19 further comprising:

illuminating the selected integrated circuit with infrared radiation from an infrared source;

locating respective positions of a plurality of optical targets that are illuminated by the infrared source on the computer screen; and aligning the positions of the optical targets with optical target reference marks on the map, whereafter step (i) is executed.

21. The method of claim 19 further comprising:

repeating steps (i) to (viii) with the altered electric design being the selected electric design.

* * * * *